United States Patent
Lee et al.

(10) Patent No.: US 8,539,293 B2
(45) Date of Patent: Sep. 17, 2013

(54) INTEGRATED CIRCUIT FOR COMPRESSION MODE SCAN TEST

(75) Inventors: Heon-Hee Lee, Hwaseong-si (KR); Hoi Jin Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 211 days.

(21) Appl. No.: 13/098,749

(22) Filed: May 2, 2011

(65) Prior Publication Data

US 2011/0289369 A1    Nov. 24, 2011

(30) Foreign Application Priority Data

May 19, 2010  (KR) .................. 10-2010-0046993

(51) Int. Cl.
*G01R 31/28*    (2006.01)
(52) U.S. Cl.
USPC .............. 714/729; 714/726; 714/727; 714/30
(58) Field of Classification Search
None
See application file for complete search history.

(56) References Cited

U.S. PATENT DOCUMENTS

| | | | | |
|---|---|---|---|---|
| 5,444,715 A | * | 8/1995 | Gruetzner et al. | 714/727 |
| 5,705,925 A | * | 1/1998 | Lee | 324/756.02 |
| 6,029,261 A | * | 2/2000 | Hartmann | 714/724 |
| 7,512,851 B2 | * | 3/2009 | Wang et al. | 714/726 |
| 2007/0011542 A1 | * | 1/2007 | Mukherjee et al. | 714/738 |
| 2008/0288838 A1 | * | 11/2008 | Anzou | 714/726 |
| 2009/0138771 A1 | * | 5/2009 | Hua | 714/727 |
| 2010/0192030 A1 | * | 7/2010 | Kapur et al. | 714/726 |
| 2011/0099442 A1 | * | 4/2011 | Hales et al. | 714/729 |
| 2011/0307750 A1 | * | 12/2011 | Narayanan et al. | 714/729 |
| 2012/0117435 A1 | * | 5/2012 | Whetsel | 714/727 |

FOREIGN PATENT DOCUMENTS

| | | |
|---|---|---|
| JP | 2006-049638 | 2/2006 |
| JP | 2008-209210 | 9/2008 |
| KR | 1020090051157 | 5/2009 |

* cited by examiner

*Primary Examiner* — John Trimmings
(74) *Attorney, Agent, or Firm* — F. Chau & Associates, LLC (57) ABSTRACT

An integrated circuit for performing a design for testability (DFT) scan test is provided. The integrated circuit includes at least one scan chain including a plurality of flip-flops, at least one interface scan chain including a plurality of flip-flops, a decompressor configured to be connected with an input terminal of the at least one interface scan chain and to decompress a first input signal and then transmit it to the at least one scan chain, a compressor configured to be connected with an output terminal of the at least one scan chain and to compress an output signal of the at least one scan chain, and at least one multiplexer configured to be connected with the decompressor and to selectively output an output signal of the decompressor or a second input signal in response to a control signal.

20 Claims, 10 Drawing Sheets

INTEGRATED CIRCUIT FOR COMPRESSION MODE SCAN TEST

CROSS-REFERENCE TO RELATED APPLICATIONS

This application claims priority under 35 U.S.C. §119(e) to Korean Patent Application No. 10-2010-0046993 filed on May 19, 2010, in the Korean Intellectual Property Office, the disclosure of which is incorporated by reference herein.

BACKGROUND

1. Technical Field

Embodiments of the present invention relate to a circuit for performing a design for testability (DFT) scan test, and more particularly, to an integrated circuit for performing a DFT scan test, which can perform different types of DFT scan tests, in a compression mode.

2. Discussion of Related Art

DFT is a name for design techniques that add certain testability features to a microelectronic hardware product design. The premise of the added features is that they make it easier to develop and apply manufacturing tests for the designed hardware. The purpose of manufacturing tests is to validate that the product hardware contains no defects that could, otherwise, adversely affect the product's correct functioning. Tests are applied at several steps in the hardware manufacturing flow and, for certain products, may also be used for hardware maintenance in the customer's environment. The tests may be driven by test programs that execute in Automatic Test Equipment (ATE) or inside the assembled system itself.

DFT circuits can be used to test integrated circuits (ICs). One method for delivering test data from chip inputs to internal circuits under test, and observing their outputs, is called a scan-design or a scan test. In a scan test, scan flip-flops in the design are connected in one or more scan chains to gain access to internal nodes of the chip. The scan test may be performed in a compression mode to reduce the testing time. However, when integrated circuits manufactured by different companies are interfaced together, it may not be possible to perform the scan test on the devices using the compression mode.

SUMMARY

At least one embodiment of the present invention provides a circuit and method that allows a scan test to be performed on integrated circuits manufactured by different companies using a compression mode.

According to an exemplary embodiment of the present invention, an integrated circuit is provided. The integrated circuit includes at least one scan chain including a plurality of flip-flops, at least one interface scan chain including a plurality of flip-flops, a decompressor, a compressor, and at least one multiplexer. The decompressor is configured to be connected with an input terminal of the at least one interface scan chain and to decompress a first input signal and then transmit it to the at least one scan chain. The compressor is configured to be connected with an output terminal of the at least one scan chain and to compress an output signal of the at least one scan chain. The at least one multiplexer is configured to be connected with the decompressor and to selectively output an output signal of the decompressor or a second input signal in response to a control signal.

The integrated circuit may be a first integrated circuit and the second input signal may be an output signal of a second integrated circuit connected with the first integrated circuit.

The second integrated circuit may include at least one second scan chain including a plurality of flip-flops, a decompressor, and a compressor. The decompressor of the second integrated circuit is configured to be connected with an input terminal of the at least one second scan chain and to decompress an input signal and then transmit it to the at least one second scan chain. The compressor of the second integrated circuit is configured to be connected with an output terminal of the at least one second scan chain and to compress an output signal of the at least one scan chain. When an interface block is connected with the at least one interface scan chain and the at least one interface scan chain is connected with the at least one multiplexer and the interface block, the second integrated circuit may perform a scan test on the interface block.

A clock signal and a scan enable signal may be input to the at least one scan chain, the at least one interface scan chain, and the at least one second scan chain, and the second integrated circuit may perform the scan test on the interface block when the scan enable signal is at a logic low and may perform the scan test on the at least one scan chain when the scan enable signal is at a logic high.

The interface block may include at least two interface circuits including a plurality of logic circuits. The at least two interface circuits may be connected with each other via a port.

The at least one multiplexer may select an output signal of the decompressor included in the second integrated circuit when the control signal is at a logic high. The at least one multiplexer may select the output signal of the decompressor included in the first integrated circuit when the control signal is at a logic low.

The first integrated circuit may be powered on while the second integrated circuit performs a scan test.

According to exemplary embodiment of the present invention, a method is provided for performing a compression mode scan test on an interface block. The method includes connecting an interface scan chain of a first integrated circuit with a second integrated circuit and storing information on the first integrated circuit in the second integrated circuit, selecting one signal from two input signals using a multiplexer included in the first integrated circuit, and performing a scan test on the interface block between the first integrated circuit and the second integrated circuit using the second integrated circuit in response to the signal selected by the multiplexer.

The two input signals may be an output signal of a decompressor included in the first integrated circuit and an output signal of a decompressor included in the second integrated circuit.

A control signal may be input to the multiplexer and the multiplexer may select the output signal of the decompressor included in the second integrated circuit when the control signal is at a logic high and may select the output signal of the decompressor included in the first integrated circuit when the control signal is at a logic low.

The method may further include performing the scan test on the interface block using the second integrated circuit when the control signal is at the logic high.

The method may further include performing the scan test on the interface block when a scan enable signal is input to the first and second integrated circuits at a logic low.

The method may further include performing the scan test on at least one scan chain included in the first integrated circuit when the scan enable signal is input to the first and second integrated circuits at a logic high.

The method may further include performing the scan test on at least one scan chain included in the second integrated circuit when the scan enable signal is input to the first and second integrated circuits at the logic high.

According to an exemplary embodiment of the invention, a circuit for performing a design for testability (DFT) scan test is provided. The circuit includes a first module connected to a second module via a plurality of ports. The first module includes a first scan chain having a plurality of first scan flip-flops chained together, a first decompressor outputting a first test signal to a first one of the first scan flip-flops, and a first compressor receiving an output of a last one of the first scan flip-flops. The second module includes a second decompressor outputting a second test signal, a multiplexer receiving the first test signal and the second test signal, a second scan chain having a plurality of second scan flip-flops chained together, where a first one of the second scan flip-flops receives an output of the multiplexer, and a second compressor receiving an output of a last one of the second scan flip-flops.

A scan enable signal may be input to the second scan flip-flops. When the scan enable signal is a first logic level, each of the second scan flip-flops may shift a signal to the first module to scan-test an interface block located partially within both the first and second modules. When the scan enable signal is at a second logic level, each of the second scan flip-flops may shift a signal to a subsequent one of the flip-flops in the chain.

BRIEF DESCRIPTION OF THE DRAWINGS

The present invention will become more apparent by describing in detail exemplary embodiments thereof with reference to the attached drawings in which.

DETAILED DESCRIPTION

The present invention now will be described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

Figure 1:
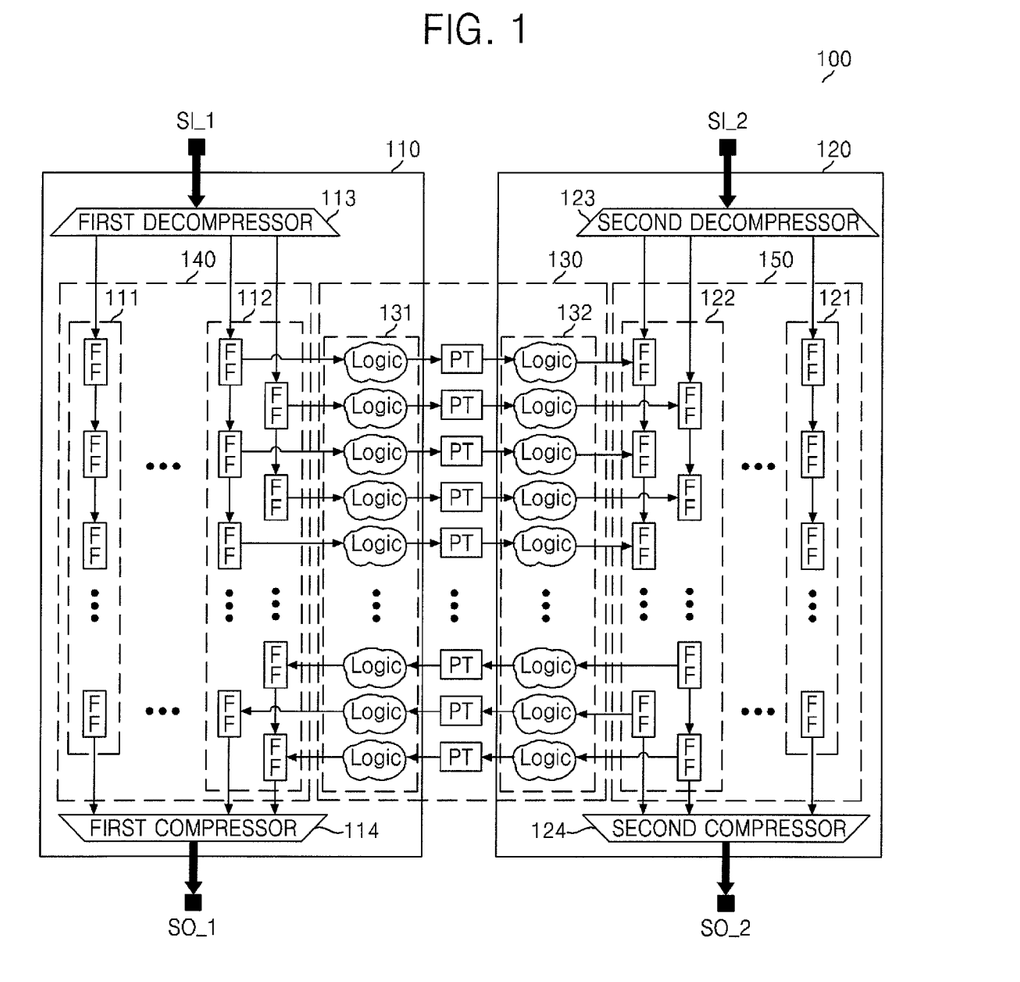
FIG. 1 is a diagram of an integrated circuit for a compression mode test as a comparison example.

FIG. 1 is a diagram of an integrated circuit 100 for a compression mode test as a comparison example. The integrated circuit 100 includes a first module 110 and a second module 120.

The first module 110 includes a first block 140, a first decompressor 113, a first compressor 114, and a first interface circuit 131. The first block 140 includes a first scan chain 111 and a second scan chain 112.

The second module 120 includes a second block 150, a second decompressor 123, a second compressor 124, and a second interface circuit 132. The second block 150 includes a third scan chain 121 and a fourth scan chain 122.

Each of the first through fourth scan chains 111, 112, 121, and 122 may include a plurality of flip-flops FF. The flip-flops FF may be scan flip-flops. A scan flip-flop may include a data input D, a test enable input TE, a test data input TI, a clock input CLK, a non-inverted output Q, and an inverted output /Q. In one embodiment of a scan chain, the non-inverted output Q of each preceding scan flip-flop is connected to the test data input TI of each subsequent scan flip-flop. One of the data input D or the test data input TI may be output as the output Q based on a logic state of the test enable input TE.

Each of the first and second interface circuits 131 and 132 may include a plurality of logic circuits. The first and second interface circuits 131 and 132 are connected to each other via ports PT. The first and second interface circuits 131 and 132 and the ports PT form a single interface block 130.

The first module 110 performs a test on the first block 140 based on a first input signal SI_1 to generate an output signal SO_1. For example, a part of the first input signal SI_1 may be applied to a test input TI of a first one of the scan flip-flops of a corresponding scan chain. To reduce a test time for the first block 140, the first block 140 is divided into the first scan chain 111 and the second scan chain 112 and the first decompressor 113 and the first compressor 114 provided in the first module 110.

As an example, when the first block 140 includes 10,000 flip-flops in total, a test time is reduced when 50 scan chains each including 200 flip-flops (e.g., scan flip-flops) connected to each other are arranged in parallel and are connected with the first decompressor 113 and the first compressor 114 as compared to a test time taken when the 10,000 flip-flops are sequentially shifted in response to an input clock signal. Consequently, the test time can be reduced by providing the first decompressor 113 and the first compressor 114.

The second module 120 has the same structure and arrangement as the first module 110. Thus, a detailed description of the second module 120 is omitted.

The first and second modules 110 and 120 are tested independently and may be tested using different methodology. For example, the test of the first module 110 may be a technique of a first company and the test of the second module 120 may be a technique of a second company. Since the test technique of the first company may be different from that of the second company, there may be a compatibility problem. As a result, a problem may occur when the interface block 130 is tested.

Figure 2:
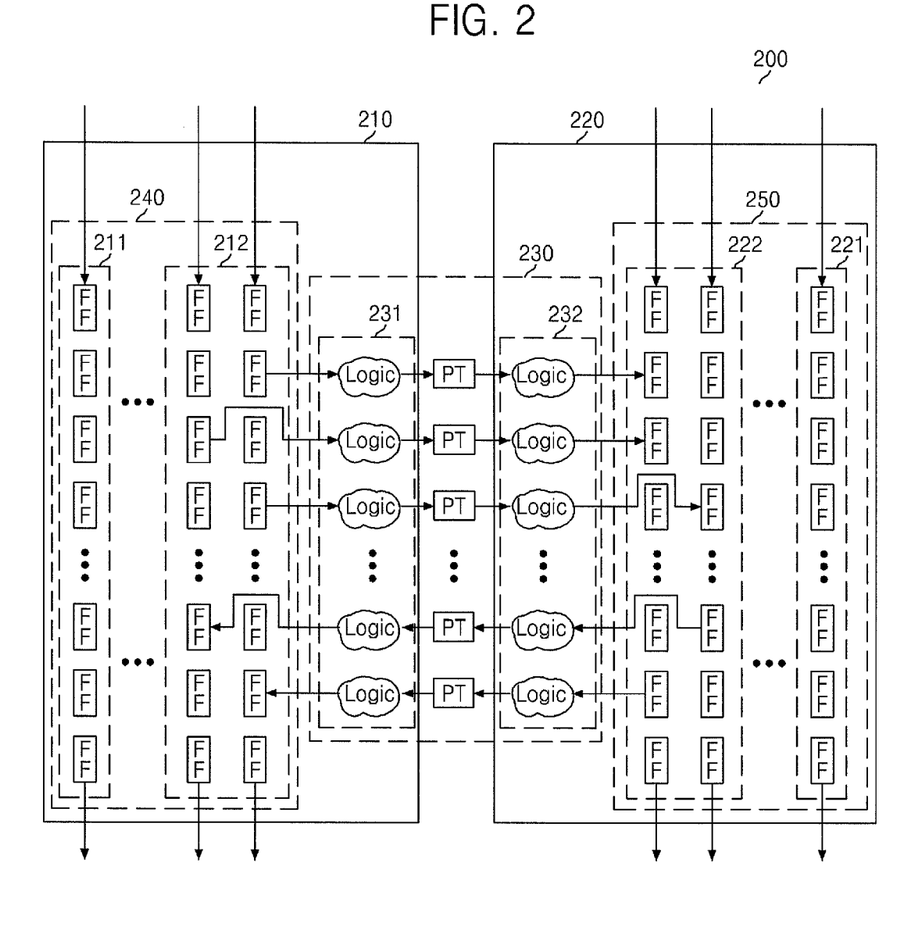
FIG. 2 is a diagram of a circuit for performing a scan test on an interface block as a comparison example.

FIG. 2 is a diagram of a circuit 200 for performing a scan test on an interface block as a comparison example. The circuit 200 for the scan test includes a first module 210 and a second module 220.

The first module 210 includes a first block 240 and a first interface circuit 231. The first block 240 includes a first scan chain 211 and a second scan chain 212. The second module 220 includes a second block 250 and a second interface circuit 232. The second block 250 includes a third scan chain 221 and a fourth scan chain 222.

Each of the first through fourth scan chains 211, 212, 221, and 222 may include a plurality of flip-flops FF (e.g., scan flip-flops). Each of the first and second interface circuits 231 and 232 may include a plurality of logic circuits. The first and second interface circuits 231 and 232 are connected to each other via ports PT. The first and second interface circuits 231 and 232 and the ports PT form a single interface block 230.

Unlike the circuit 100 for the compression mode scan test illustrated in FIG. 1, the circuit 200 for the scan test does not includes a decompressor and a compressor in either of the first and second modules 210 and 220. Accordingly, the circuit 200 does not use the compression mode, so that a test can be compatibly performed between the first module 210 and the second module 220. However, the circuit 200, which does not use the compression mode, has a longer test time than the circuit 100 using the compression mode.

Figure 3A:
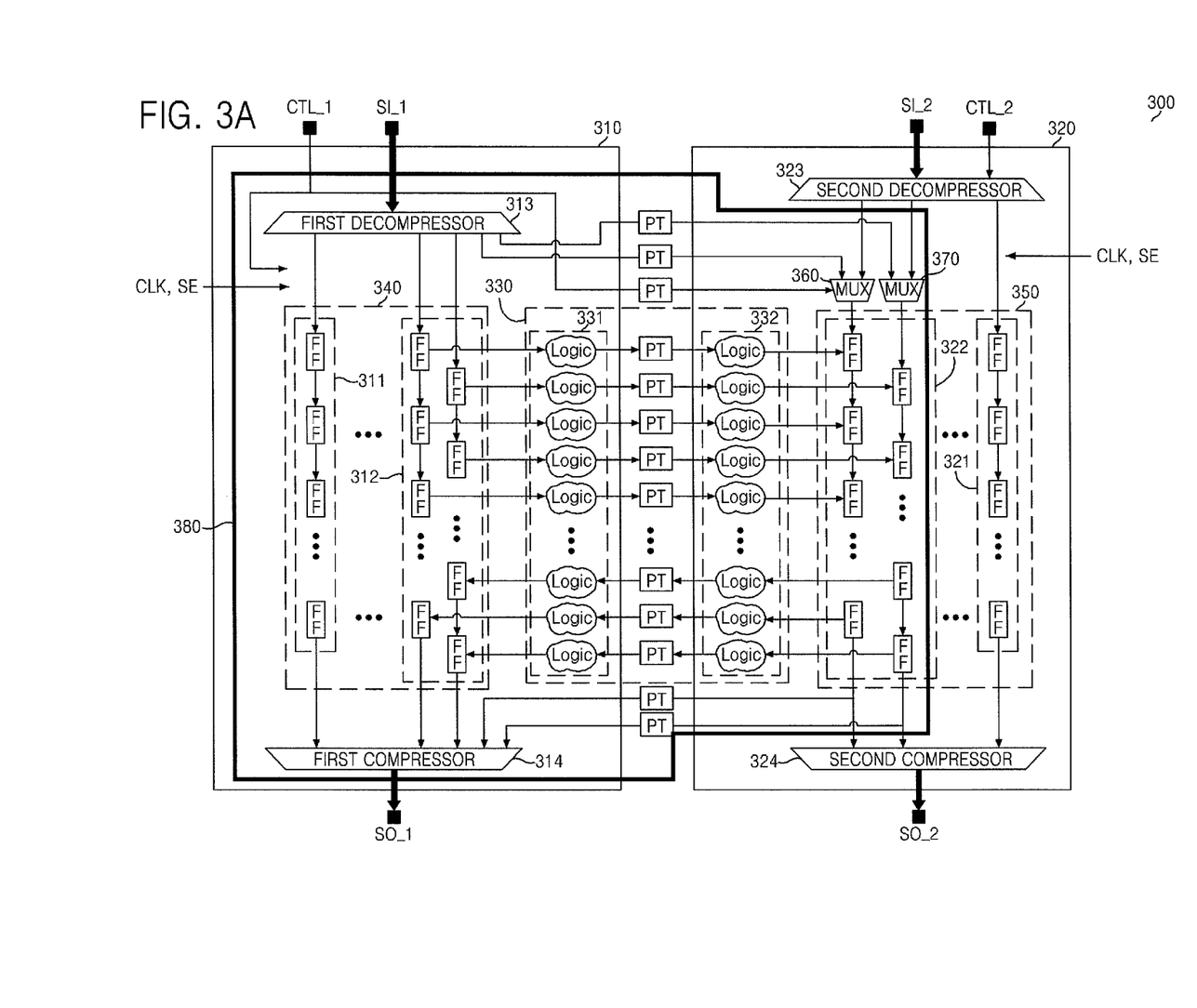
FIG. 3A is a diagram of an integrated circuit for a compression mode scan test according to an exemplary embodiment of the present invention.

FIG. 3A is a diagram of an integrated circuit 300 for a compression mode scan test according to an exemplary embodiment of the present invention. The integrated circuit 300 includes a first module 310 and a second module 320. The first and second modules 310 and 320 may be modules for a compression mode scan test. The first module 310 may be a second integrated circuit and the second module 320 may be a first integrated circuit.

Here, a module may be a functional or structural combination of hardware for realizing embodiments of the present invention and software for driving the hardware. For example, the module may be a logical or functional unit of a predetermined program code and a hardware resource for performing the program code and does not necessarily indicate a physically connected program code or a certain type of hardware.

The first module 310 includes a first block 340, a first decompressor 313, a first compressor 314, and a first interface circuit 331. The first block 340 includes a first scan chain 311 and a second scan chain 312.

The second module 320 includes a second block 350, a second decompressor 323, a second compressor 324, and a second interface circuit 332. The second block 350 includes a third scan chain 321 and an interface scan chain 322.

Each of the first through third scan chains 311, 312, and 321 and the interface scan chain 322 may include a plurality of flip-flops FF (e.g., scan flip-flops). Each of the first and second interface circuits 331 and 332 may include a plurality of logic circuits. The first and second interface circuits 331 and 332 are connected to each other via at least one port PT. The first and second interface circuits 331 and 332 and the at least one port PT form a single interface block 330.

The first module 310 performs a scan test on the first block 340 based on a first input signal SU_1 to generate an output signal SO_1. To reduce a test time for the first block 340, the first block 340 is divided into the first scan chain 311 and the second scan chain 312 and the first decompressor 313 and the first compressor 314 provided in the first module 310.

The first and second scan chains 311 and 312 of the first block 340 may include a plurality of flip-flops FF (e.g., scan flip-flops). When a first logic signal is input to the first and second scan chains 311 and 312, each flip-flop FF stores the first logic signal until a second logic signal following the first logic signal is input. When the second logic signal is input, the flip-flop FF stores the second logic signal and outputs the first logic signal to a subsequent flip-flip FF.

The first decompressor 313 decompresses the first input signal SI_1 and then outputs it to the first and second scan chains 311 and 312. The first compressor 314 compresses an output signal of the first scan chain 311 and an output signal of the second scan chain 312.

The first decompressor 313 may be connected with the interface scan chain 322 via a first multiplexer (MUX) 360 and a second MUX 370 and the first compressor 314 may be connected with the interface scan chain 322, so that a third module 380 is formed. Accordingly, the interface block 330 is connected with the first decompressor 313 and the first compressor 314 of the first module 310 and is thus tested by testing the third module 380. The test of the third module 380 is performed in a compression mode using the first decompressor 313 and the first compressor 314 of the first module 310.

Accordingly, when the second module 320 is connected with the first module 310 through the first MUX 360 and the second MUX 370, the interface block 330 can be scan-tested.

The second module 320 is fundamentally the same as the second module 120 illustrated in FIG. 1 with the exception that the interface scan chain 322 is connected with the second decompressor 323 via either of the first and second MUXs 360 and 370. The first and second MUXs 360 and 370 will be described in detail with reference to FIG. 3B below. The integrated circuit 300 may perform a scan test on the first and second modules 310 and 320 separately or simultaneously.

Figure 3B:
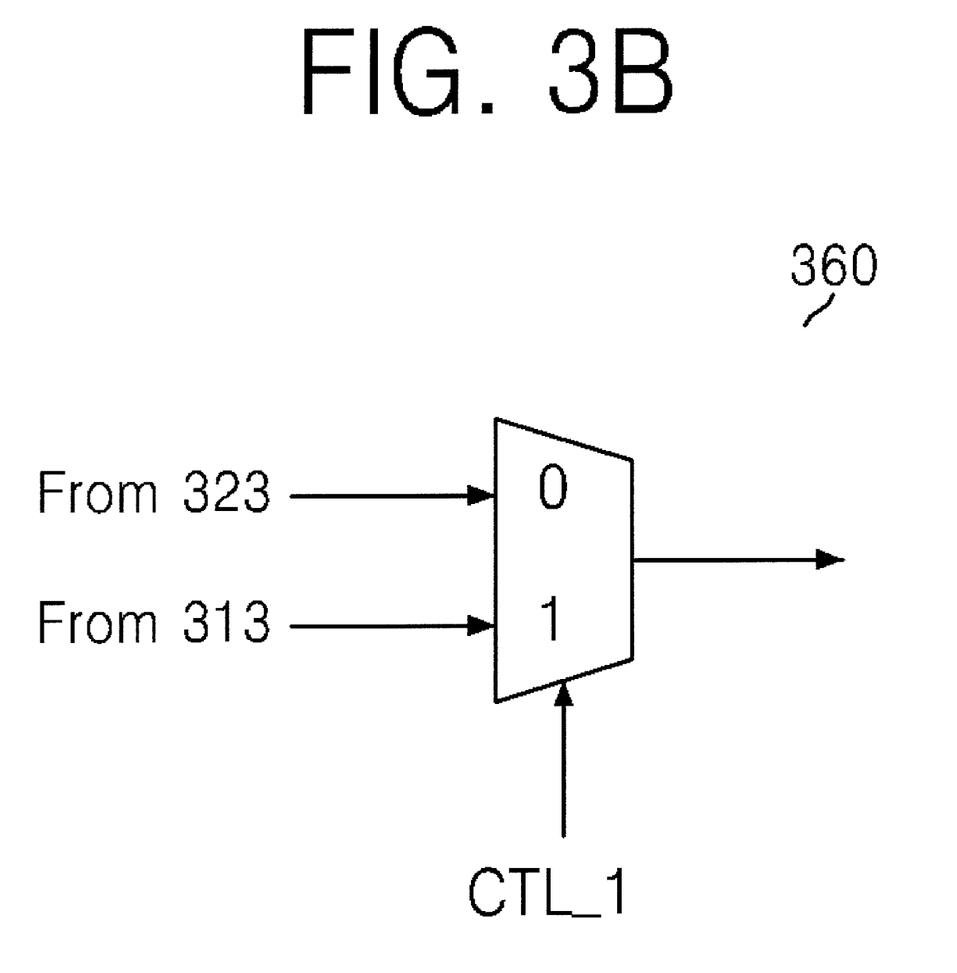
FIG. 3B is an example of a multiplexer illustrated in FIG. 3A.

FIG. 3B is an example of either of the first and second MUXs 360 and 370 illustrated in FIG. 3A. It is assumed that the MUX shown in FIG. 3B is the first MUX 360. Referring to FIG. 3B, the first MUX 360 is connected with the first decompressor 313 and the second decompressor 323 and may selectively transmit a signal from the first or second decompressor 313 or 323 to the interface scan chain 322 in response to a first control signal CTL_1. For example, the first MUX 360 may select a signal from the first decompressor 313 when the first control signal CTL_1 is "1" and select a signal from the second decompressor 323 when the first control signal CTL_1 is "0". The number of MUXs is not limited to the two shown in FIG. 3A, as a fewer or greater number MUXs may be present.

Figure 4:
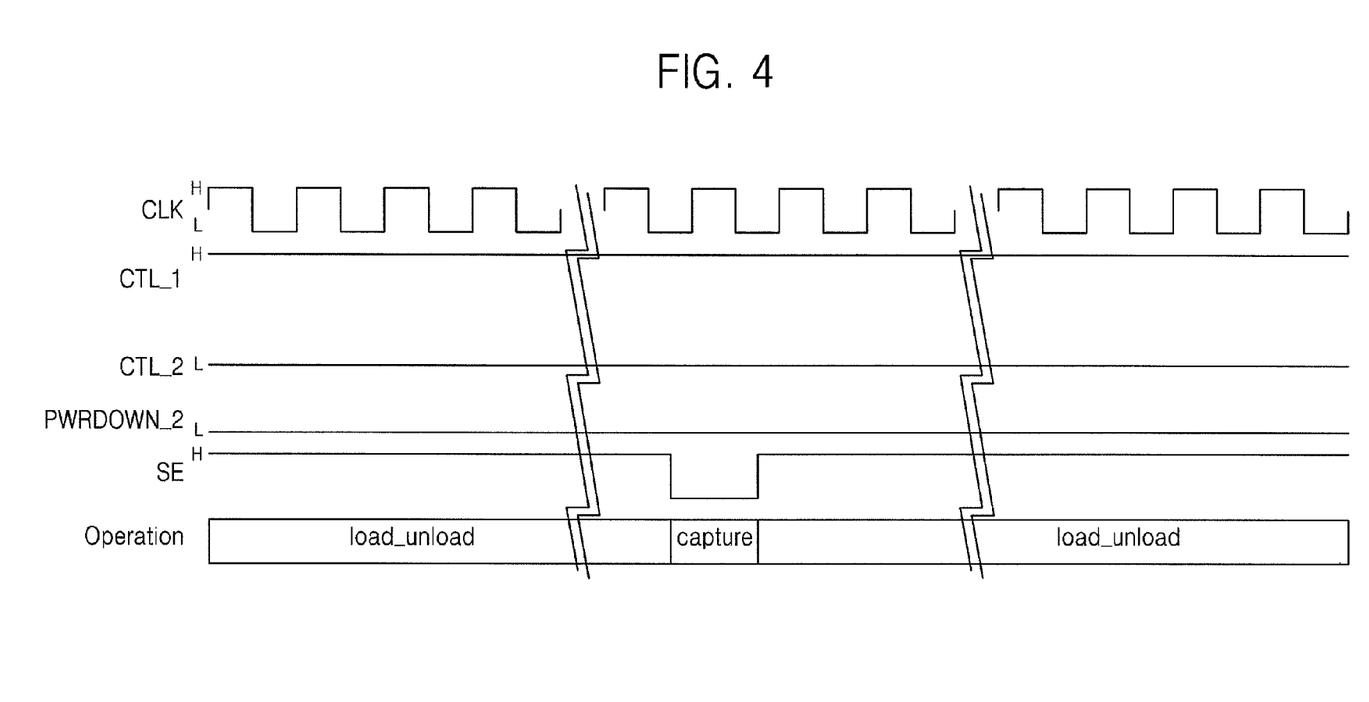
FIG. 4 is an exemplary timing diagram of a scan test performed on a first module illustrated in FIG. 3A.

FIG. 4 is an exemplary timing diagram of the scan test of the first module 310 illustrated in FIG. 3A. Referring to FIGS. 3A through 4, while a test clock CLK is input to the integrated circuit 300, the first control signal CTL_1 for the scan test of the first module 310 is input at a logic high and a second control signal CTL_2 for the scan test of the second module 320 is input at a logic low. As described with reference to FIG. 3B, the first MUX 360 (or the second MUX 370) selectively transmits the signal from the first decompressor 313 to the interface scan chain 322 in response to the first control signal CTL_1 at the logic high. At this time, the second module 320 is powered on for the test of the interface block 330. For example, a power down signal PWRDOWN_2 of the second module 320 set at a logic low in FIG. 4 means that the power of the second module 320 is ON.

Since the interface scan chain 322 is included in the second module 320 as well as the third module 380, the second module 320 is in a power-on state. Since the second control signal CTL_2 is at the logic low, the test of the second module 320 is not performed.

A scan enable signal SE is input to the flip-flops FF (e.g., scan flip-flops) of the first module 310. For example, the scan enable signal SE may be input to the test input TI of each of the flip-flops. When the scan enable signal SE is at a logic low, each flip-flop FF shifts a signal to the interface block 330 so that the interface block 330 is tested, which corresponds to a capture mode. When the scan enable signal SE is at a logic high, each flip-flop FF shifts a signal to another flip-flop FF (e.g., a subsequent FF in the chain). Since a flip-flop FF receiving a signal from another flip-flop FF shifts the signal to yet another flip-flop FF, this operation is referred to as a load/unload mode.

Figure 5:
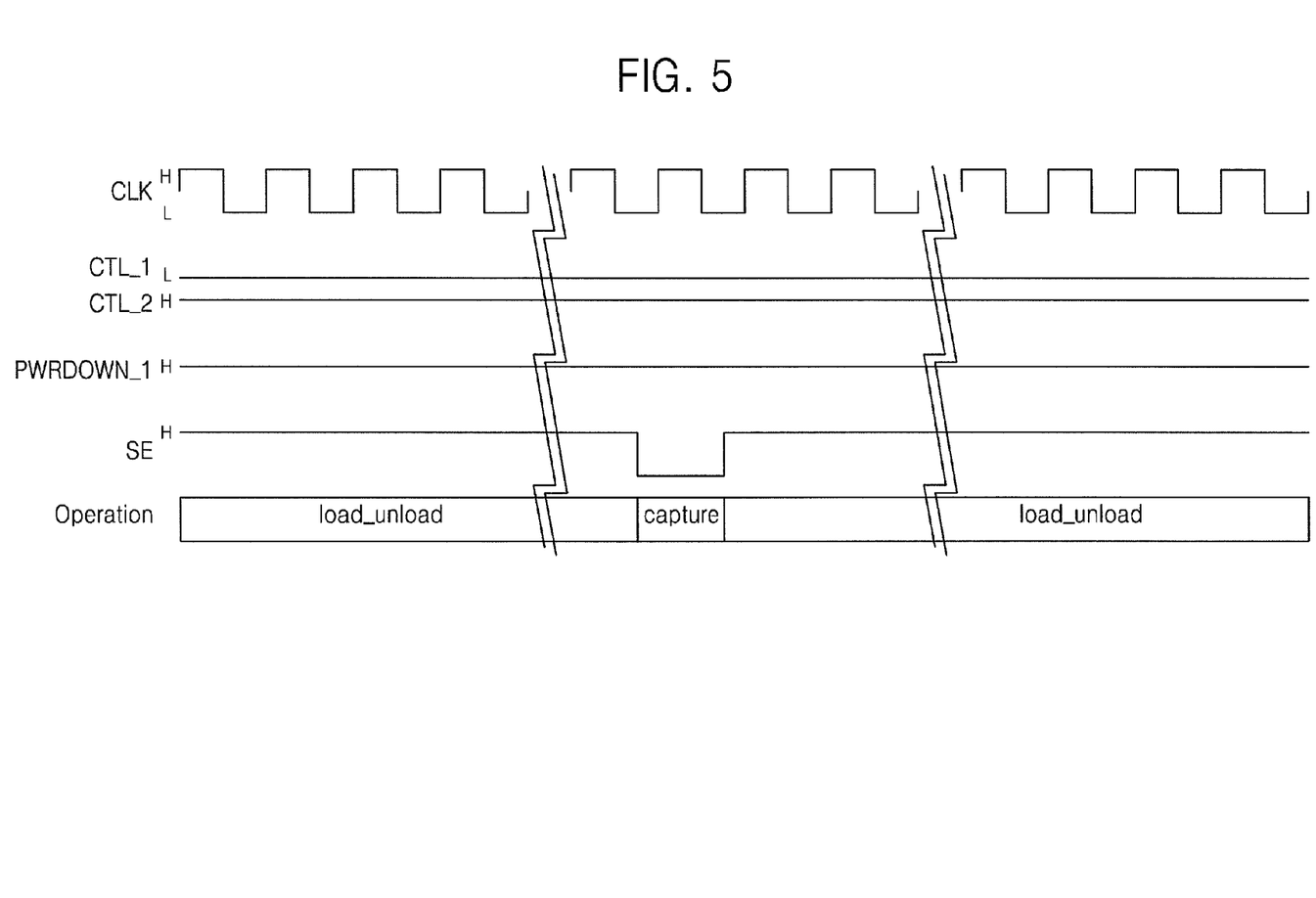
FIG. 5 is an exemplary timing diagram of a scan test performed on a second module illustrated in FIG. 3A.

FIG. 5 is a timing diagram of the scan test of the second module 320 illustrated in FIG. 3A. Referring to FIGS. 3A and 3B and FIG. 5, while a test clock CLK is input to the integrated circuit 300, a second control signal CTL_2 for the test of the second module 320 is input at a logic high and the first control signal CTL_1 for the test of the first module 310 is input at a logic low. As described with reference to FIG. 3B, the first MUX 360 (or the second MUX 370) selectively transmits the signal from the second decompressor 323 to the interface scan chain 322 in response to the first control signal CTL_1 at the logic low. At this time, the second module 320 is powered on for the scan test of the interface block 330. For example, a power down signal PWRDOWN_1 of the first module 310 set at a logic high in FIG. 5 means that the power of the first module 310 is OFF.

Since it is not necessary to power on the first module 310 while the second module 320 is tested, power can be saved. For example, when the first control signal CTL_1 is at the logic low, the test of the first module 310 is not performed.

A scan enable signal SE is input to the flip-flops FF of the second module 320. When the scan enable signal SE is at a logic low, each flip-flop FF shifts a signal to the interface block 330 so that the interface block 330 is scan-tested, which corresponds to a capture mode. When the scan enable signal SE is at a logic high, each flip-flop FF shifts a signal to another flip-flop FF (e.g., a subsequent FF in the chain). Since a flip-flop FF receiving a signal from another flip-flop FF shifts the signal to yet another flip-flop FF, this operation is referred to as a load/unload mode.

Figure 6A:
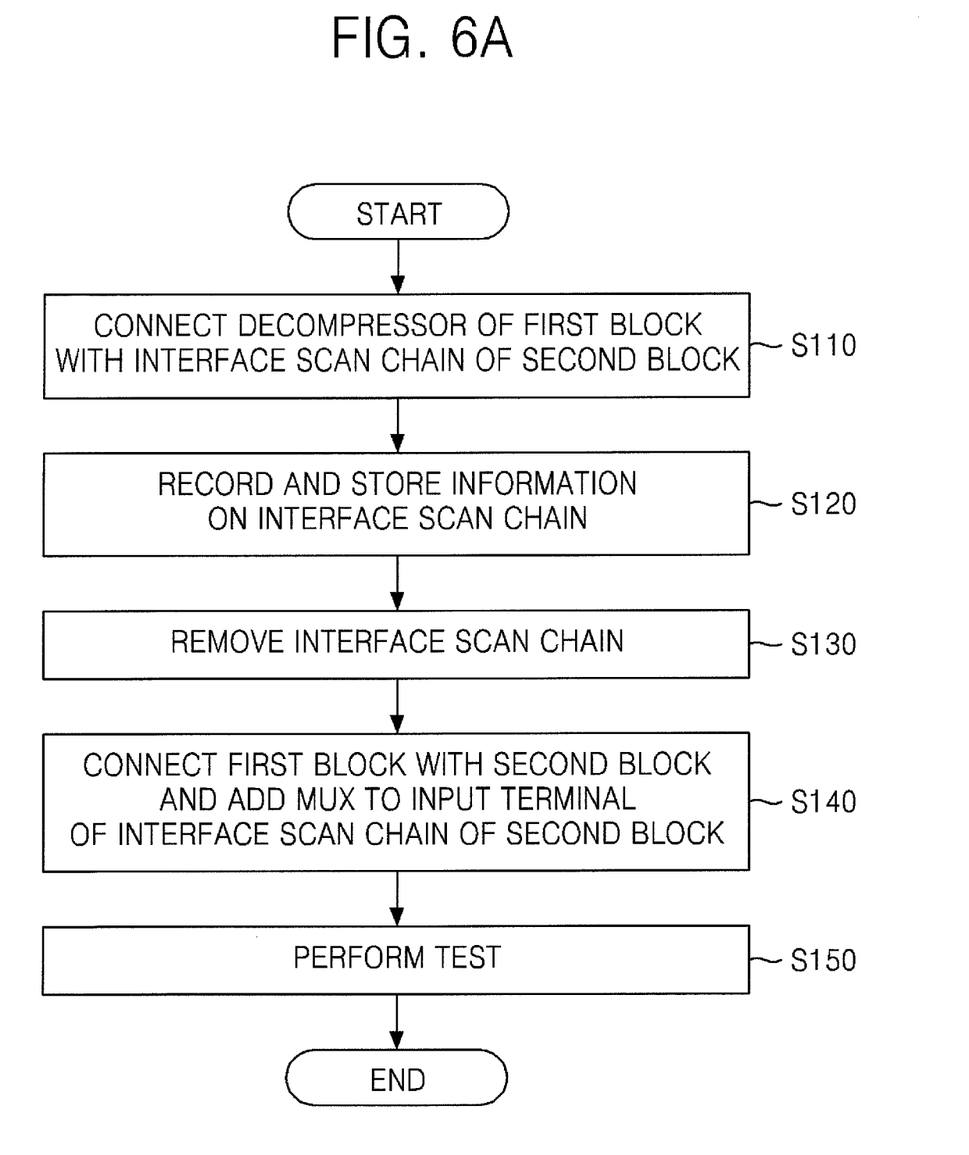
FIG. 6A is a flowchart of a method of performing a compression mode scan test according to an exemplary embodiment of the present invention.
Figure 6B:
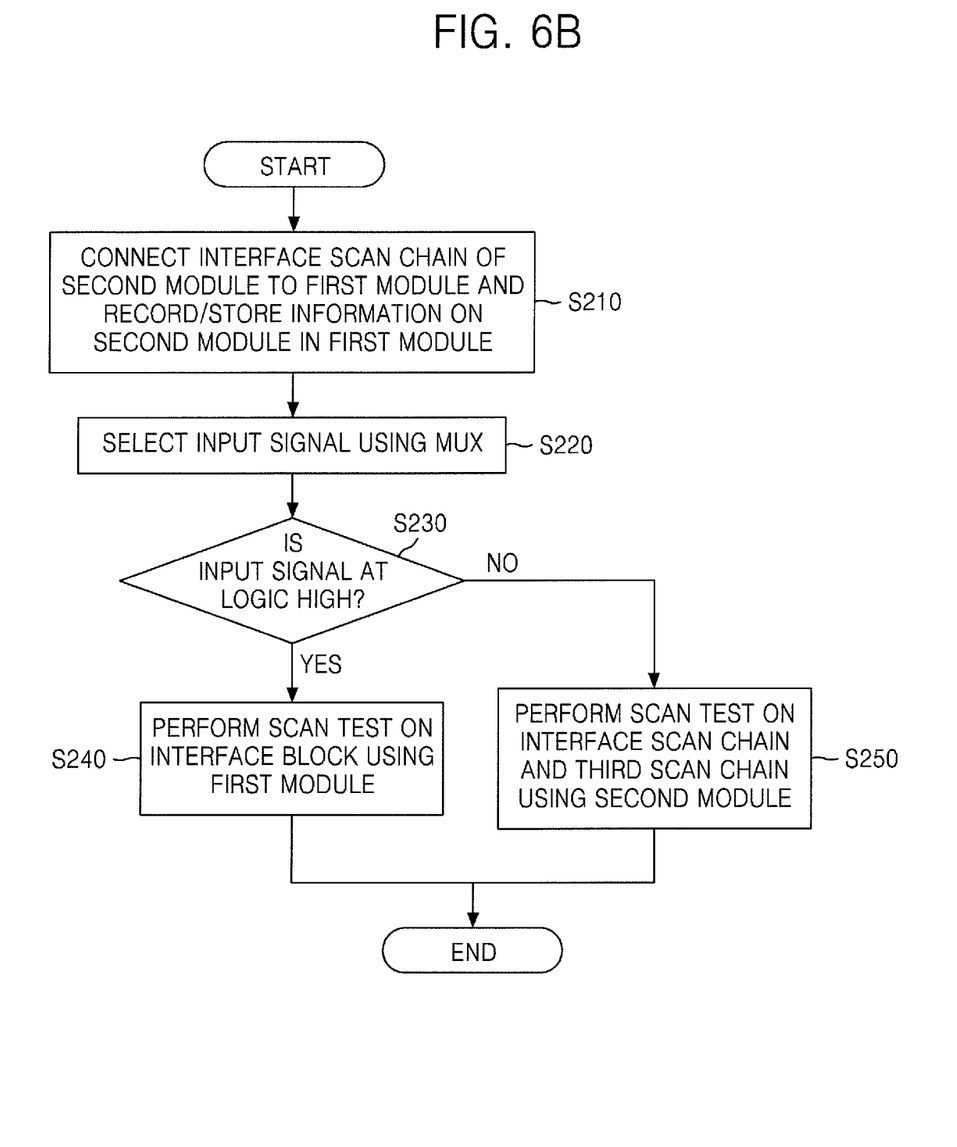
FIG. 6B is a flowchart of a method of performing a compression mode scan test on an interface block according to an exemplary embodiment of the present invention.
Figure 7A:
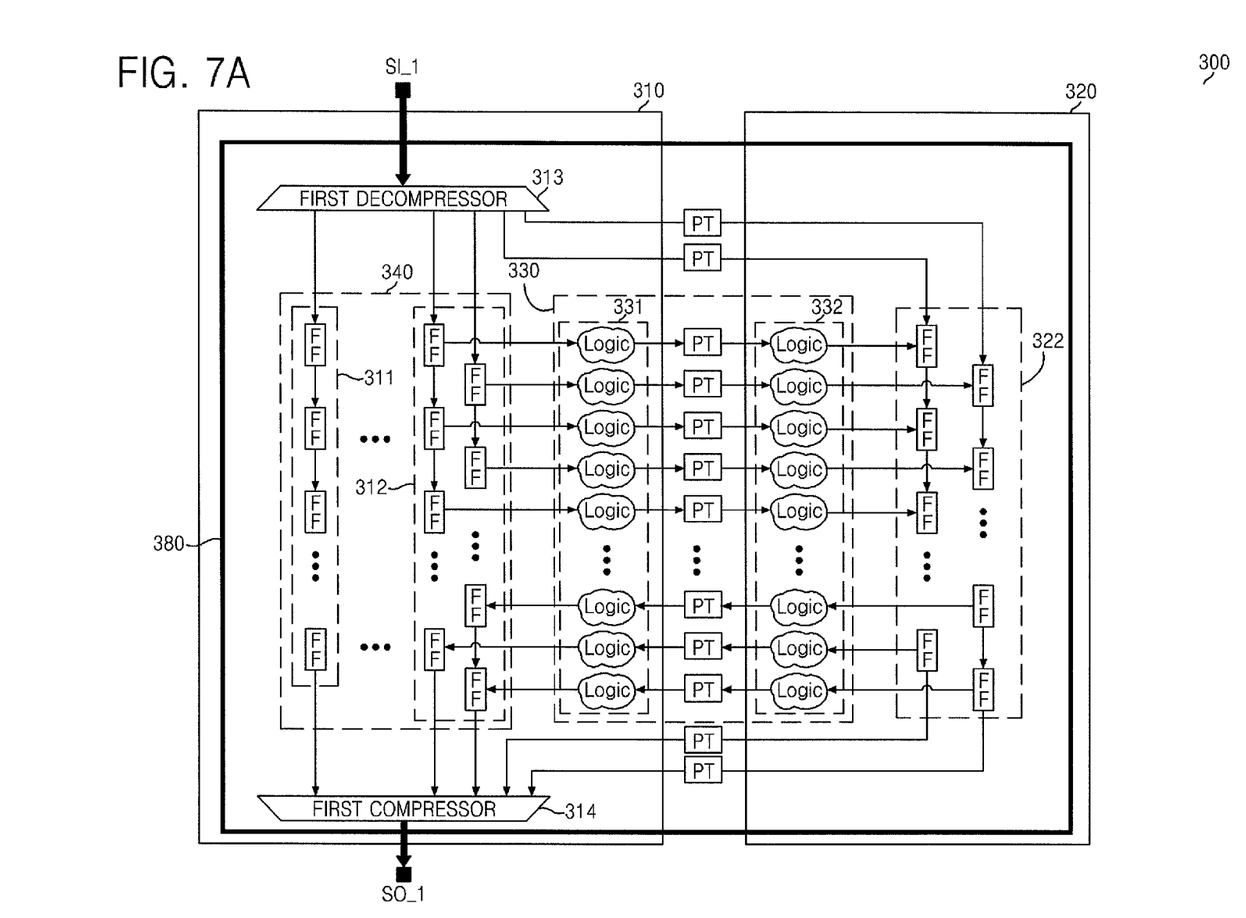
FIGS. 7A and 7B are diagrams for explaining the methods illustrated in FIGS. 6A and 6B.
Figure 7B:
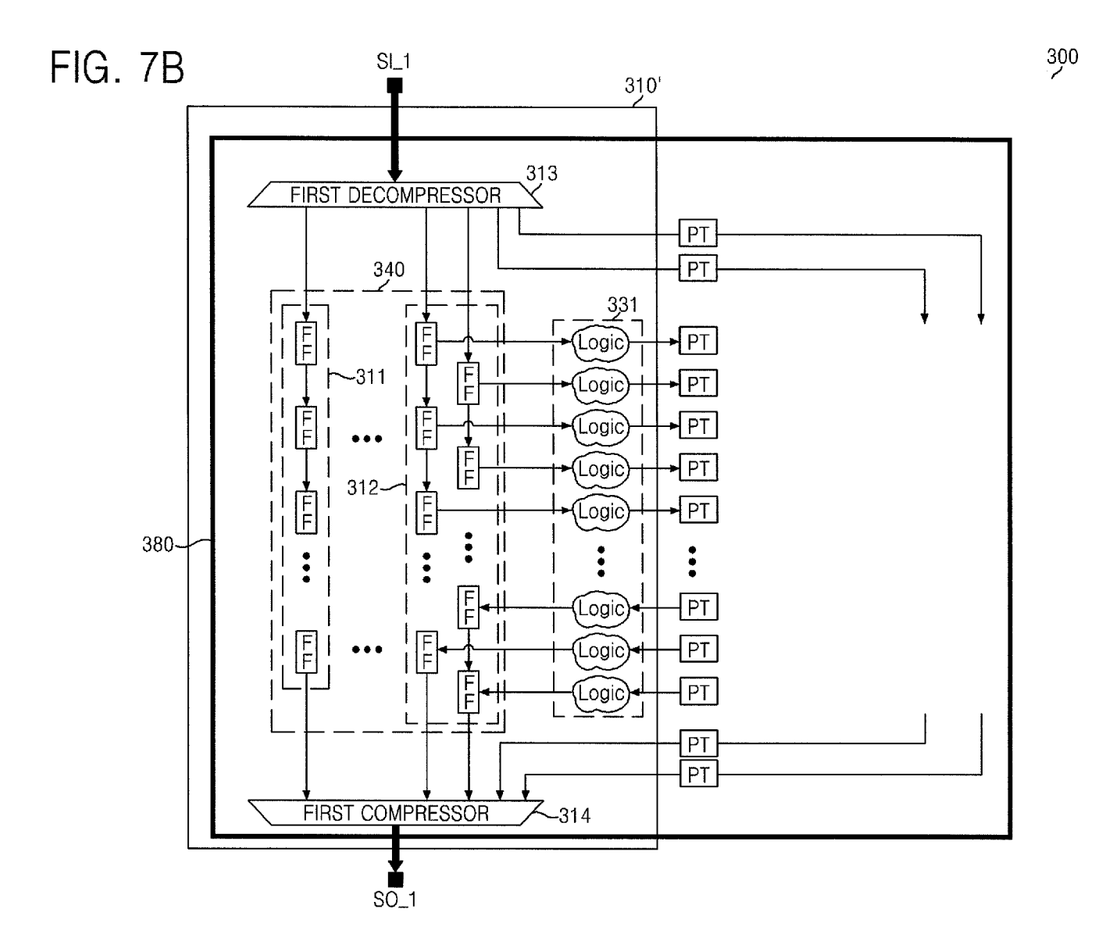

FIG. 6A is a flowchart of a method of performing a compression mode scan test according to an exemplary embodiment of the present invention. FIG. 6B is a flowchart of a method of performing a compression mode scan test on the interface block 330 according to an exemplary embodiment of the present invention. FIGS. 7A and 7B are diagrams for explaining the methods illustrated in FIGS. 6A and 6B. The method illustrated in FIG. 6A also includes a method of using a compression mode for modules subjected to different types of scan tests.

Referring to FIGS. 6A through 7B, the first decompressor 313 of the first module 310 is connected to the interface scan chain 322 of the second module 320 as illustrated in FIG. 7A in operation S110. Next, information (e.g., the number of scan chains and the number of flip-flops FF) on the interface scan chain 322 is recorded and stored in a separate storage block (not shown) of the first module 310 or the first decompressor 313 in operation S120 or S210. The interface scan chain 322 is removed as illustrated in FIG. 7B in operation S130. As a result, a new first module 310' illustrated in FIG. 7B is obtained. Accordingly, even when the second module 320 subjected to a scan test different from a scan test used for the first module 310 is connected, the first and second interface circuits 331 and 332 can be tested using the stored information on the interface scan chain 322.

The new first module 310' shown in FIG. 7B is connected to the second module 320 and at least one MUX is added between the interface scan chain 322 and the first and second decompressors 313 and 323 in operation S140. Then, the integrated circuit 300 illustrated in FIG. 3A is obtained. Next, a test of the integrated circuit 300 illustrated in FIG. 3A is performed in operation S150. Consequently, the compression mode can be used between modules subjected to different types of scan tests.

For example, the MUX selects one of two input signals (e.g., the output signal of the first decompressor 313 or the output signal of the second decompressor 323) in response to a control signal in operation S220.

When the control signal is at a logic high in operation S230, the MUX selects the output signal of the first decompressor 313 and the interface block 330 is scan-tested while the first module 310 performs a scan test in operation S240. In this example, the scan test of the interface block 330 is performed only when a scan enable signal is at a logic low. However, embodiments of the present invention are not limited thereto. For example, the scan test of the interface block 330 may be performed only when the scan enable signal is at a logic high.

When the control signal is at a logic low in operation S230, the MUX selects the output signal of the second decompressor 323 and the second module 320 performs a scan test on the interface scan chain 322 and the third scan chain 350 in operation S250, but the scan test of the interface block 330 is not performed.

According to at least one embodiment of the present invention, even when devices manufactured by different companies are interfaced with one another, a test using a compression mode may be performed efficiently on the interfaced devices and testing time may be reduced.

While the present invention has been particularly shown and described with reference to exemplary embodiments thereof, it will be understood by those of ordinary skill in the art that various changes in forms and details may be made therein without departing from the spirit and scope of the disclosure.

What is claimed is:

1. An integrated circuit for performing a design for testability (DFT) scan test, the integrated circuit comprising:
   a first integrated circuit;
   wherein the first integrated circuit comprises:
      at least one scan chain comprising a plurality of flip-flops;
      at least one interface scan chain comprising a plurality of flip-flops;
      a decompressor configured to be connected with an input terminal of the at least one interface scan chain and to decompress a first input signal and then transmit the decompressed first input signal to the at least one scan chain;
      a compressor configured to be connected with an output terminal of the at least one scan chain and to compress an output signal of the at least one scan chain; and
      at least one multiplexer configured to be connected with the decompressor and to selectively output an output signal of the decompressor or a second input signal in response to a control signal.

2. The integrated circuit of claim 1, wherein the integrated circuit further comprising:
   a second integrated circuit;
   wherein the second input signal is an output signal of the second integrated circuit connected with the first integrated circuit.

3. The integrated circuit of claim 2, wherein the second integrated circuit comprises:
   at least one second scan chain comprising a plurality of flip-flops;
   a decompressor configured to be connected with an input terminal of the at least one second scan chain and to decompress an input signal and then transmit it to the at least one second scan chain; and a compressor configured to be connected with an output terminal of the at least one second scan chain and to compress an output signal of the at least one second scan chain, and when an interface block is connected with the at least one interface scan chain and the at least one interface scan chain is connected with the at least one multiplexer and the interface block, the second integrated circuit performs a scan test on the interface block.

4. The integrated circuit of claim 3, wherein a clock signal and a scan enable signal are input to the at least one scan chain, the at least one interface scan chain, and the at least one second scan chain, and when the scan enable signal is at a logic low, the second integrated circuit performs the scan test on the interface block.

5. The integrated circuit of claim 3, wherein a clock signal and a scan enable signal are input to the at least one scan chain, the at least one interface scan chain, and the at least one second scan chain, and when the scan enable signal is at a logic high, the second integrated circuit performs the scan test on the at least one scan chain.

6. The integrated circuit of claim 3, wherein the interface block comprises at least two interface circuits comprising a plurality of logic circuits.

7. The integrated circuit of claim 6, wherein the at least two interface circuits are connected with each other via a port.

8. The integrated circuit of claim 3, wherein the at least one multiplexer selects an output signal of the decompressor of the second integrated circuit when the control signal is at a logic high.

9. The integrated circuit of claim 3, wherein the at least one multiplexer selects the output signal of the decompressor of the first integrated circuit when the control signal is at a logic low.

10. The integrated circuit of claim 3, wherein the first integrated circuit is powered on while the second integrated circuit performs the scan test.

11. A method of performing a compression mode scan test on an interface block, the method comprising:

connecting an interface scan chain of a first integrated circuit with a second integrated circuit and storing information on the first integrated circuit in the second integrated circuit;

selecting, by the first integrated circuit, one of an output signal of a decompressor located in the first integrated circuit and an output signal of a decompressor located in the second integrated circuit; and performing a scan test on the interface block between the first integrated circuit and the second integrated circuit using the second integrated circuit in response to the selected signal.

12. The method of claim 11, wherein the first integrated circuit comprises a multiplexer that performs the selecting.

13. The method of claim 12, wherein a control signal is input to the multiplexer and the multiplexer selects the output signal of the decompressor included in the second integrated circuit when the control signal is at a logic high.

14. The method of claim 12, wherein a control signal is input to the multiplexer and the multiplexer selects the output signal of the decompressor included in the first integrated circuit when the control signal is at a logic low.

15. The method of claim 13, further comprising performing the scan test on the interface block using the second integrated circuit when the control signal is at the logic high.

16. The method of claim 15, further comprising performing the scan test on the interface block when a scan enable signal is input to the first and second integrated circuits at a logic low.

17. The method of claim 15, further comprising performing the scan test on at least one scan chain included in the first integrated circuit when a scan enable signal is input to the first and second integrated circuits at a logic high.

18. The method of claim 15, further comprising performing the scan test on at least one scan chain located in the second integrated circuit when a scan enable signal is input to the first and second integrated circuits at a logic high.

19. A circuit for performing a design for testability (DFT) scan test, the circuit comprising:

a first module connected to a second module via a plurality of ports, wherein the first module comprises:

a first scan chain comprising a plurality of first scan flip-flops chained together;

a first decompressor outputting a first test signal to a first one of the first scan flip-flops;

a first compressor receiving an output of a last one of the first scan flip-flops, wherein the second module comprises: a second decompressor outputting a second test signal;

a multiplexer receiving the first test signal and the second test signal;

a second scan chain comprising a plurality of second scan flip-flops chained together, wherein a first one of the second scan flip-flops receives an output of the multiplexer; and a second compressor receiving an output of a last one of the second scan flip-flops.

20. The circuit of claim 19, wherein a scan enable signal is input to the second scan flip-flops, and when the scan enable signal is a first logic level, each of the second scan flip-flops shifts a signal to the first module to scan-test an interface block located partially within both the first and second modules, and when the scan enable signal is at a second logic level, each of the second scan flip-flops shifts a signal to a subsequent one of the flip-flops in the chain.

* * * * *